(12) United States Patent
Hsiao et al.

(10) Patent No.: US 7,758,338 B2
(45) Date of Patent: Jul. 20, 2010

(54) SUBSTRATE CARRIER, PORT APPARATUS AND FACILITY INTERFACE AND APPARATUS INCLUDING SAME

(75) Inventors: Yi-Li Hsiao, Hsinchu (TW); Chen-Hua Yu, Hsin-Chu (TW); Jean Wang, Hsin-Chu (TW); Fu-Kang Tien, Hsinchu (TW); Jui-Pin Hung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 471 days.

(21) Appl. No.: 11/754,789

(22) Filed: May 29, 2007

(65) Prior Publication Data

US 2008/0298933 A1 Dec. 4, 2008

(51) Int. Cl.
*F27B 5/16* (2006.01)
(52) U.S. Cl. ........................ 432/200; 432/205; 432/198
(58) Field of Classification Search ................. 432/152, 432/198, 200, 205, 250, 237, 253; 118/724, 118/725, 729; 206/711; 141/63, 98; 220/324
See application file for complete search history.

(56) References Cited

U.S. PATENT DOCUMENTS

| | | | | |
|---|---|---|---|---|
| 4,854,863 A * | 8/1989 | Hemsath | ..................... | 432/176 |
| 5,813,851 A * | 9/1998 | Nakao | ............................ | 432/6 |
| 5,902,102 A * | 5/1999 | Nam et al. | .................. | 432/152 |
| 6,435,865 B1 * | 8/2002 | Tseng et al. | ................. | 432/152 |
| 6,540,509 B2 * | 4/2003 | Asano et al. | ................. | 432/205 |
| 6,863,732 B2 * | 3/2005 | Asano et al. | ................. | 118/715 |
| 6,922,867 B1 * | 8/2005 | Hao | ........................... | 15/318 |
| 7,418,982 B2 * | 9/2008 | Yu et al. | ....................... | 141/63 |
| 7,427,375 B1 * | 9/2008 | Cushman | ..................... | 266/252 |
| 2003/0009904 A1 * | 1/2003 | Tokunaga | ..................... | 34/406 |
| 2007/0166657 A1 * | 7/2007 | Sakata et al. | ................. | 432/250 |
| 2007/0267461 A1 * | 11/2007 | Yu et al. | ...................... | 228/101 |

* cited by examiner

*Primary Examiner*—Gregory A Wilson
(74) *Attorney, Agent, or Firm*—Duane Morris LLP

(57) ABSTRACT

An apparatus includes a first enclosure, a first door, at least one first valve, at least one inlet diffuser and at least one substrate holder. The first enclosure has a first opening. The first door is configured to seal the first opening. The first valve is coupled to the first enclosure. The inlet diffuser is coupled to the first valve and configured to provide a first gas with a temperature substantially higher than a temperature of an environment around the first enclosure. Each substrate holder disposed within the first enclosure supports at least one substrate.

23 Claims, 15 Drawing Sheets

SUBSTRATE CARRIER, PORT APPARATUS AND FACILITY INTERFACE AND APPARATUS INCLUDING SAME

BACKGROUND OF THE INVENTION

1. Field of the Invention

The present invention relates to carriers, port apparatuses and facility interfaces, and more particularly to semiconductor wafer carriers, port apparatuses and facility interfaces.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed along with techniques for overcoming manufacturing obstacles associated with these materials and requirements.

FIG. 1A is a schematic drawing showing a traditional via hole structure. A copper layer 110 is formed over a substrate 100. An ultra low-k dielectric layer 120 is formed over the copper layer 110. A via hole 130 is formed within the ultra low-k dielectric layer 120 to expose the top surface of the copper layer 110. If the copper layer 110 is exposed to air, the top surface of the copper layer 110 reacts with oxygen in air, forming a copper oxide layer 140 due to oxidation. The situation becomes worse if moisture is also involved. The copper oxide layer 140 can adversely affect the electrical connection between the top surface of the copper layer 110 and a conductive via plug filled into the via hole 130. In addition, the ultra low-k dielectric layer 120 by itself absorbs moisture when exposed to air. Accordingly, great care should be taken to avoid exposure to air during critical process steps, such as via opening, formation of copper seed layers, copper chemical mechanical polish (CMP) and formation of the ultra low-k dielectric material.

Traditionally, after a critical process step, the substrate 100 is removed from the process chamber that performs the critical process step and temporarily stored in a FOUP until subsequent processing. When the door of the FOUP is removed to allow placement of the substrate 100 in the FOUP, air from the surrounding environment including oxygen, moisture and/or airborne molecular contamination (AMC), flows into the FOUP. After the door is closed, the air is sealed within the FOUP with the substrate 100. As described above, oxygen tends to react with the copper layer 110 formed over the substrate 100 to form the copper oxide layer 140.

In order to address this problem, a "Q-time" is required after a critical process step is performed in the semiconductor manufacturing process. The next process must be performed on the substrate within a set predetermined time period or Q-time, such as from 2 to 4 hours. If a subsequent process, such as formation of a barrier layer, does not occur within the time period, a cleaning process is required to remove any copper oxide layer 140 that may be formed over the copper layer 110.

Due to high integration of semiconductor devices over substrate 100, a semiconductor process usually has a plurality of the critical steps, each with an associated Q-time designed to protect the substrate. These Q-time requirements complicate the manufacturing processes. In addition, if a Q-time is missed, additional steps such as cleaning steps increase process time and complexity.

FIG. 1B is a schematic cross-sectional view of a prior art FOUP. The FOUP 150 protects wafers stored therein from being contaminated by particles within the environment having AMC around the FOUP 150. The AMC may be generated from facility pumping systems. The FOUP 150 includes an enclosure 160 and a door 170. The enclosure 160 includes a frame 165. The enclosure 160 also includes outlet check valve 173 and inlet check valve 175.

During removing the door 170 or open the enclosure 160, AMC diffuses into the enclosure 160. After the door 170 is transferred to seal the enclosure 160, AMC remains in the enclosure 160. In order to remove AMC in the enclosure 160, the inlet check valve 175 is disposed at the bottom of the enclosure 160 through which nitrogen is provided into the enclosure 160 to carry away AMC from the enclosure 160. Nitrogen provided within the enclosure 160 may push the door 170 away from the enclosure 160. The outlet check valve 173 is disposed at the bottom of the enclosure 160 through which AMC within the enclosure 160 can be removed.

When the door 170 is configured to seal the enclosure 160, the door 170 is transferred and contacts a gasket 180 so as to seal the enclosure 160 to prevent particles flowing into the enclosure 160. When the enclosure 160 is unsealed, the door 170 is unlocked and transferred directly away from the enclosure 160.

From the foregoing, it can be seen that improved cassettes or carriers and facility interfaces therefor are desired.

SUMMARY OF THE INVENTION

In accordance with some exemplary embodiments, an apparatus includes a first enclosure, a first door, at least one first valve, at least one inlet diffuser and at least one substrate holder. The first enclosure has a first opening. The first door is configured to seal the first opening. The first valve is coupled to the first enclosure. The inlet diffuser is coupled to the first valve and configured to provide a first gas with a temperature substantially higher than a temperature of an environment around the first enclosure. Each substrate holder disposed within the first enclosure supports at least one substrate.

The above and other features will be better understood from the following detailed description of the embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DETAILED DESCRIPTION OF EXEMPLARY EMBODIMENTS

Figure 1A:
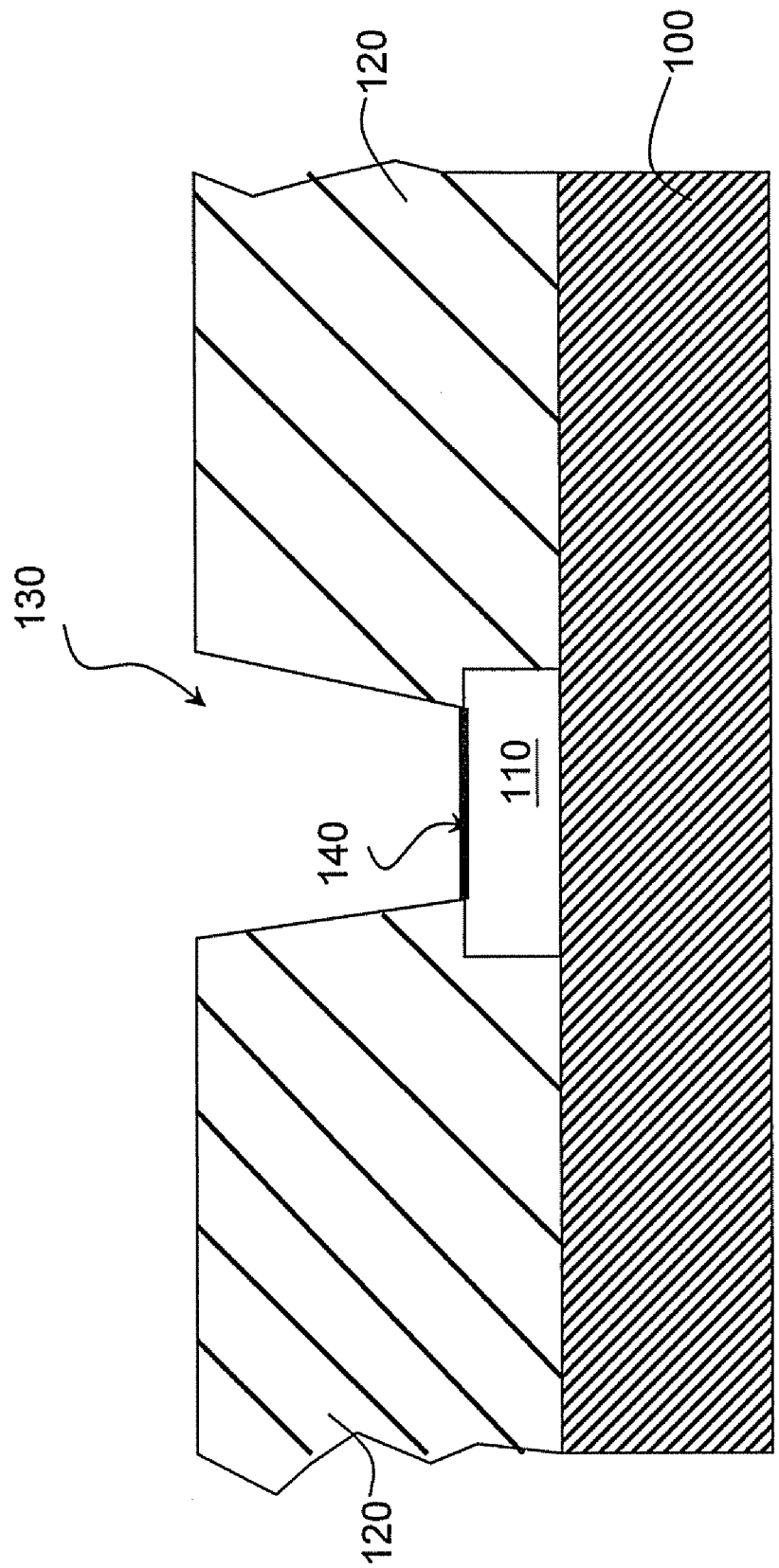
FIG. 1A is a schematic cross-sectional view showing a traditional via hole structure.
Figure 1B:
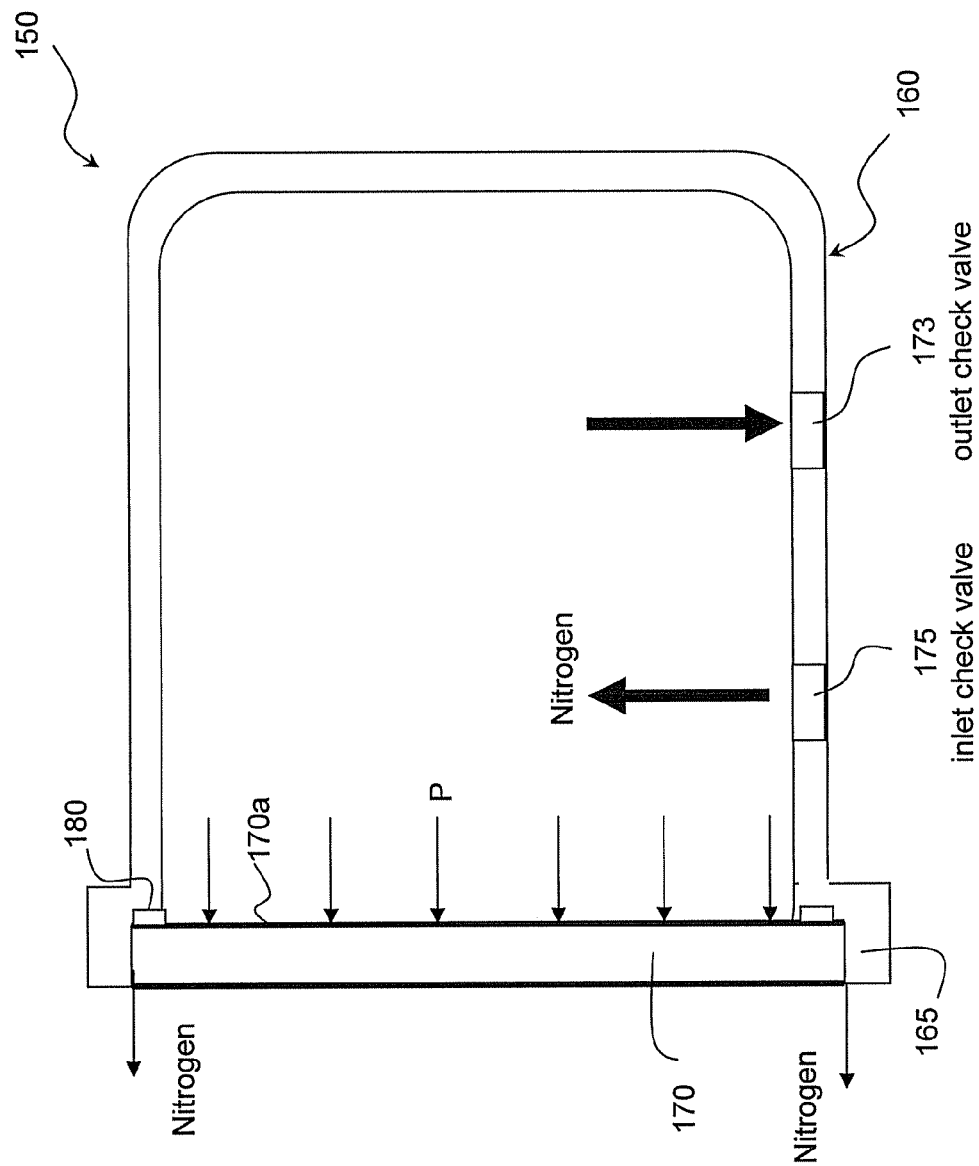
FIG. 1B is a schematic cross-sectional view of a prior art FOUP.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

Figure 2A:
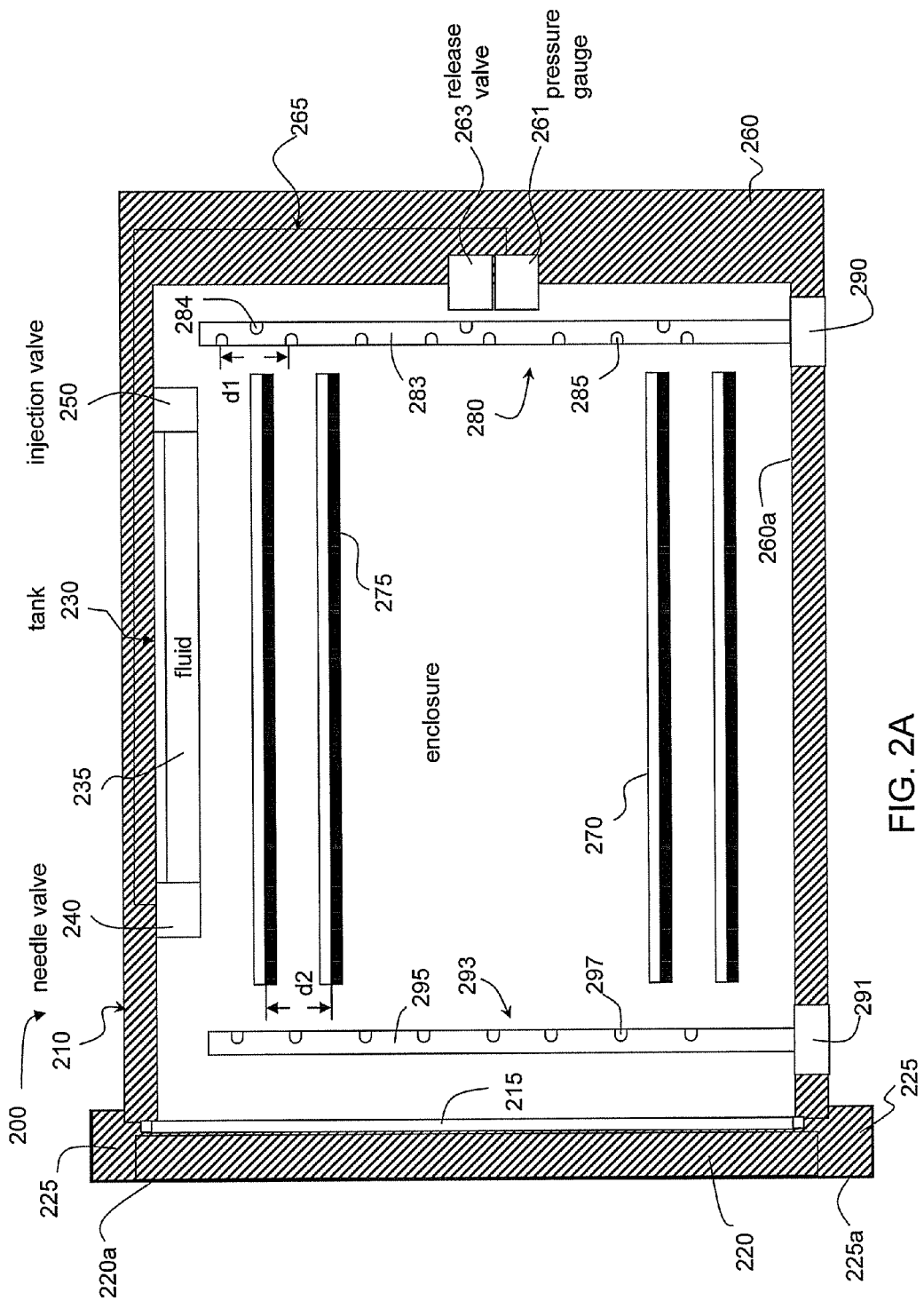
FIG. 2A is a schematic cross-sectional view of an exemplary wafer carrier.

FIG. 2A is a schematic cross-sectional view of an exemplary wafer carrier. The carrier 200 can be, for example, a cassette, front opening unified pod (FOUP), reticle carrier or other carrier known in the art for carrying one or more semiconductor substrates. In one embodiment, the carrier 200 is a FOUP and the door 220 is located on a side of the carrier 200. In the illustrated embodiment, the carrier 200 includes a frame 225 so that the door 220 can be moved into and from the frame 225. The door 220 may be joined to the frame 225 and against a sealing apparatus 215 so as to desirably seal the enclosure 210. Further, a surface 225a of the frame 225 is attached to a sealing apparatus (not shown) that may be disposed on a facility interface, not shown in FIG. 2A, but shown in FIG. 4A.

The carrier 200 may comprise an enclosure 210 comprising a door 220 for opening and closing the enclosure 210. A hollow tank 230 is coupled to the carrier or formed integrally therein. The tank 230 can be, for example, a square, rectangular, oval or other shape that is adapted to store a fluid. FIG. 2A shows the tank 230 located proximate to a wall 260, such as the top wall, of the enclosure 210. In other embodiments, the tank 230 may be located away from the door 220 so that the position of the tank 230 will not interfere transfer of substrates 270. The tank 230 can be vertically or horizontally disposed on a sidewall, top wall or bottom wall of the carrier 200. In still other embodiments, the tank 230 can be disposed on the door 220. The tank 230, which is essentially a tank, contains at least one fluid 235 therein, shown partially filling tank 230. The fluid 235 may comprise at least one gas or liquid of nitrogen ($N_2$), hydrogen ($H_2$), ammonia ($NH_3$), or other reduction gas or mixture thereof.

The tank 230 may include at least one valve, such as a needle valve 240 and an injection valve 250. The needle valve 240 may release a gas formed by the fluid 235 within the tank 230 into the carrier 200 when the pressure within the carrier 200 is at or lower level than a predetermined or measured pressure, for example, the environmental pressure (e.g., 1 atm). The injection valve 250 may allow for introducing the fluid 235 into the tank 230 when the amount of the fluid 235 within the tank 230 is lower than a predetermined or desired amount.

Still referring to FIG. 2A, at least one substrate holder 275 is disposed within the enclosure 210 and coupled to at least one of the walls 260 of the enclosure 210 to carry at least one wafer substrate, display substrate, such as liquid crystal display (LCD), plasma display, cathode ray tube display or electro luminescence (EL) lamp, light emitting diode (LED) substrate or reticle (collectively referred to as, substrate 270), for example. The substrate holders 275 are provided to support the substrates 270. The substrate holders 275 can be, for example, plates, small extrusions on or grooves within the walls 260 or other holding structures capable of holding the substrate 270.

Figure 2B:
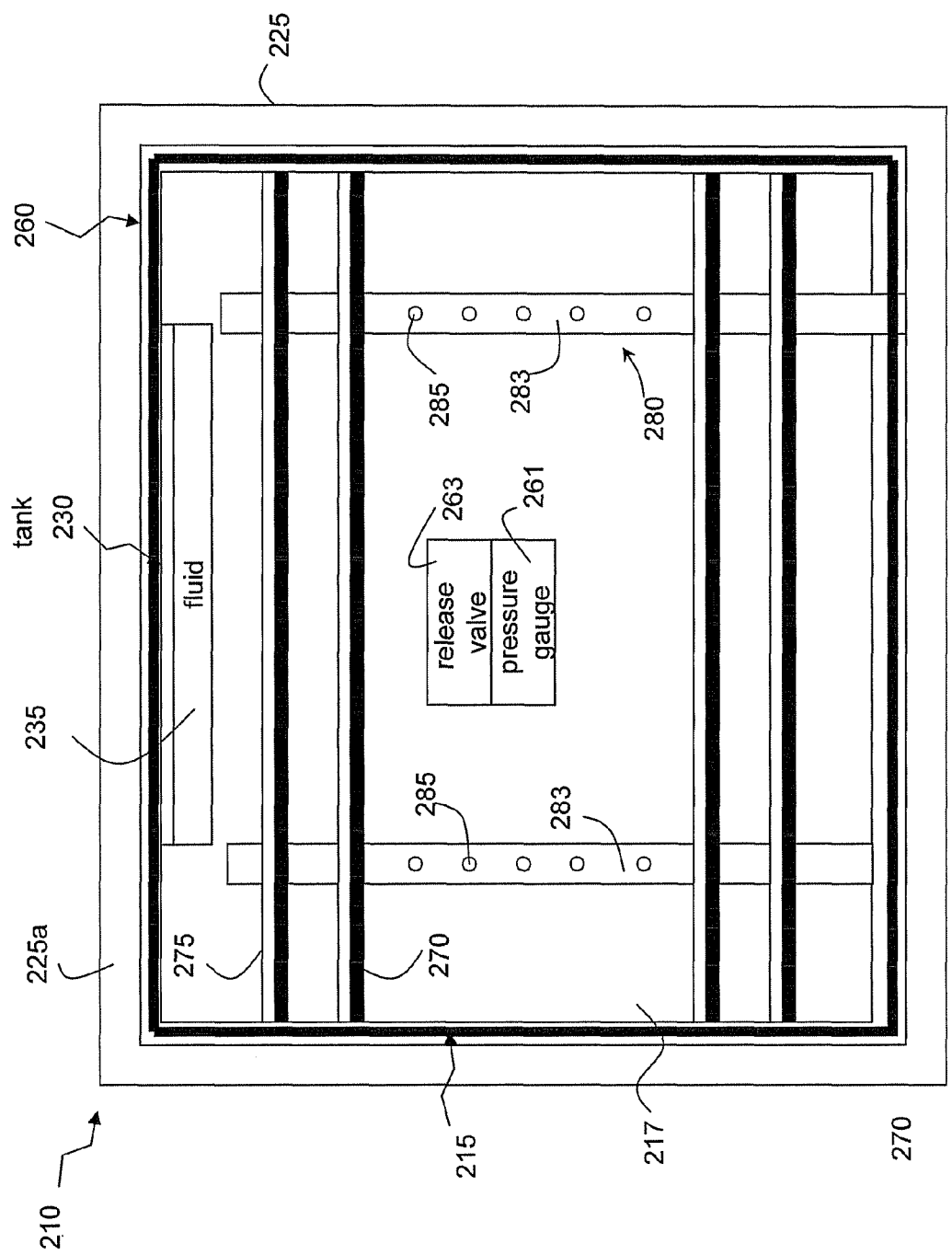
FIG. 2B is a schematic end view of an exemplary enclosure shown with the door of the carrier removed.

FIG. 2B is an end view of an exemplary enclosure 210 shown with the door 220 of the carrier 200 removed. In FIG. 2B, like items are indicated by like reference numbers as in FIG. 2A. In this view, the sealing apparatus 215 can be seen disposed around the opening 217 of the enclosure 210. The sealing apparatus 215 may be, for example, a rubber strip, O-ring, gel or other apparatus adapted to seal the carrier 200. In some embodiments, the sealing apparatus 215 may comprise a material such as a mixture of vinyl-functional polysiloxane, fumed silica and platinum compound.

Again referring to FIG. 2A, in one embodiment, pressure gauge 261 and release valve 263 are disposed on the sidewall 260 of the enclosure 210. The pressure gauge 261 is adapted to sense the pressure within the carrier 200. The release valve 263 is adapted to adjust the pressure within the carrier 200 when the pressure within the carrier 200 is higher than a desired pressure limit, such as about 2.5 atm. In other embodiments, other pressure limits may be used. Adjusting the pressure within the carrier 200 can prevent potential explosions resulting from a volatile reduction gas within the carrier 200 as described above. In some embodiments, the pressure gauge 261 senses the pressures within and outside the carrier 200. If the pressure within the carrier 200 is higher than the pressure outside the carrier 200 by a certain amount, the pressure gauge 261 sends a signal to the valve 263 to trigger release of at least some of gas within the carrier 200.

In some embodiments, the release valve 263 includes a spring (not shown) which has a mechanical property such that the pressure within the carrier 200 presses the spring to open the release valve 263. For those embodiments, the pressure gauge 261 is not required as the release valve 263 is pressure sensitive and configured as needed. In other exemplary embodiments, the release valve 263 may include a piezoelectric material which has a material property such that the pressure within the carrier 200 presses the piezoelectric material to generate a signal to operate the release valve 263. For this embodiment, the pressure gauge 261 is optional.

In some embodiments, the carrier 200 may be as described in commonly assigned and U.S. patent application Ser. No. 11/419,914, filed on May 23, 2006, now U.S. Pat. No. 7,418, 982, issued Sep. 2, 2008, the entire contents of which are hereby incorporated by reference herein.

In some embodiments, the material of the enclosure 810 (shown in FIG. 8A) may be formed of material such as polytetrafluoroethylene (PTFE) "TEFLON®" and/or perfluoroalkoxy (PFA) teflon. In some embodiments, PTFE teflon or PFA "TEFLON®" may be coated on the inside surfaces 260a of the enclosure 210. The PTFE "TEFLON®" or PFA "TEFLON®" enclosure 210 absorb and/or release less moisture than a traditional polycarbonate (PC) enclosure. Accordingly, the PTFE "TEFLON®" or PFA "TEFLON®" enclosure 210 may maintain a desired moisture level after moisture within the enclosure 210 is desirably removed as described below in conjunction with FIGS. 3A-3B.

Referring to FIGS. 2A and 2B, the enclosure 210 may further comprise at least one inlet diffuser 280 and at least one valve 290. The inlet diffuser 280 may be coupled to the valve 290 so as to provide a gas to the enclosure 210. In some embodiments, the inlet diffuser 280 may be configured to provide a gas with a temperature substantially higher than a temperature of environment around the enclosure 210. In some embodiments, the temperature of the gas may be between about 70° C. and about 80° C., but other temperatures may be used in other exemplary embodiments. In some embodiments, the gas may comprise at least one of nitrogen, helium, neon, argon, krypton, xenon, radon or other gas that is adequate to dry, remove or carry away moisture from the enclosure 210.

In some embodiments, the valve 290 may be an one-way valve which can be opened when the valve 290 coupled to an exhaust system (not shown) and may desirably seal the enclosure 210 after the valve 290 is disconnected from the exhaust system.

In some embodiments, the inlet diffuser 280 may comprise at least one tube 283, plate or other structure having at least one opening 285 such that the gas, e.g., hot nitrogen, is capable of being provided into the carrier 200 through the openings 285. In some embodiments, a distance "d1" between two adjacent openings 285 may be substantially equal to a distance "d2" between two adjacent substrate holders 275 such that the gas, e.g., hot nitrogen, may be desirably provided to the surfaces of the substrates 270 and desirably remove moisture from the top surfaces (not labeled) of the substrates 270.

In various exemplary embodiments, the openings 285 may be round, triangular, square, rectangular, or other shapes that are adequate to provide a desired amount of gas into the enclosure 210 or combinations thereof. In some embodiments, the openings 285 may have a dimension between about 0.2 millimeter (mm) and about 0.3 mm, but other dimensions may be used in other exemplary embodiments. In some embodiments, at least one of the openings 285 may be configured in the region between two adjacent substrates 270 such that the gas, e.g., hot nitrogen, can be desirably delivered to the surfaces of the substrates 270. In some embodiments, the tube 283 may include at least one opening such as openings 284 facing the inside surface 260a of the walls 260 such that the hot nitrogen can desirably remove moisture attached on the insider surfaces 260a of the walls 260. The openings 284 may be configured in the top, middle and/or bottom regions of the tube 283.

Referring again to FIG. 2A, the enclosure 210 may include an outlet diffuser 293 coupled to a valve 291 in some exemplary embodiments. In some embodiments, the outlet diffuser 293 may comprise a tube 295 having at least one opening such as openings 297 thereon. The outlet diffuser 293 may be configured to remove gas, moisture and/or AMC from the enclosure 210 through the openings 297. The valve 291 may be coupled to an exhaust system (not shown) such that the exhaust system may desirably remove gas and/or moisture from the enclosure 210.

In some embodiments, the valve 291 may be an one-way valve which can be opened when the valve 291 coupled to an exhaust system (not shown) and may desirably seal the enclosure 210 after the valve 291 is disconnected from the exhaust system.

Figure 2E:
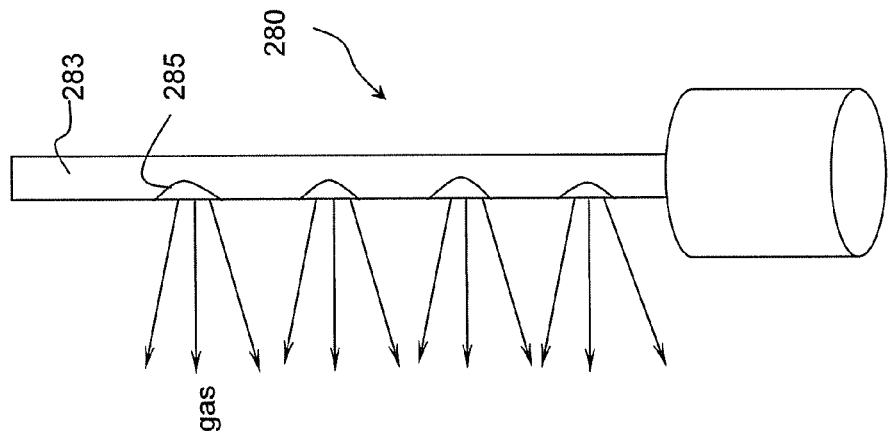
FIGS. 2C-2E are perspective views of exemplary diffusers.
Figure 2D:
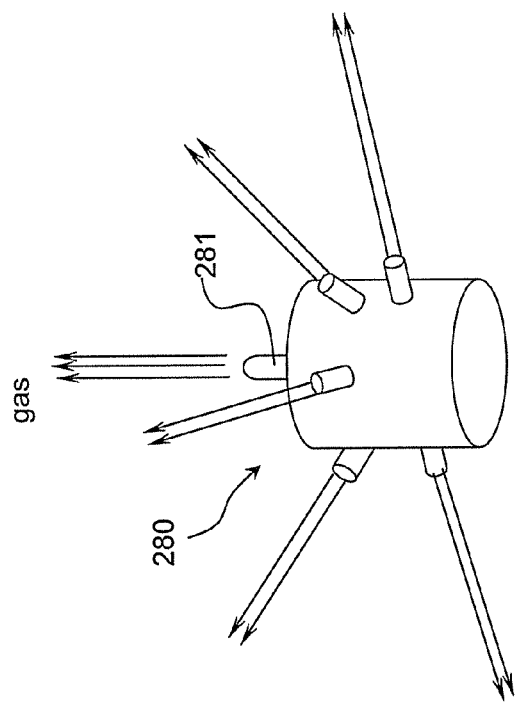
Figure 2C:
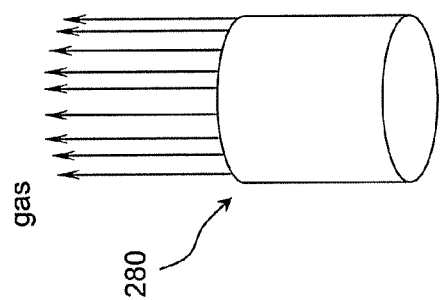

FIGS. 2C-2E are perspective views showing exemplary diffusers.

Referring to FIG. 2C, the inlet diffuser 280 may include at least one opening (not visible) on at least one surface of the inlet diffuser 280 such that the gas can be desirably provided through the openings and into the carrier 200 shown in FIG. 2A. FIG. 2C does not include the tube 283 as shown in FIG. 2A. In some embodiments, the opening (not shown) may be round, triangular, square, rectangular, other shapes that are adequate to provide a desired amount of gas into the enclosure 210 or combinations thereof. In some embodiments, the openings (not shown) may have a dimension between about 0.2 millimeter (mm) and about 0.3 mm, but other suitable dimensions may be used in other exemplary embodiments.

Referring to FIG. 2D, the inlet diffuser 280 may comprise at least one short tube 281 disposed on at least one surface of the inlet diffuser 280. The short tubes 281 may be directed in various directions such that the gas, e.g., hot nitrogen, can be desirably delivered into the enclosure 210 accordingly. In some embodiments, the cross section of the short tubes 281 may be round, triangular, square, rectangular, other shapes that are adequate to provide a desired amount of gas into the enclosure 210 or combinations thereof. In some embodiments, the short tubes 281 may have an inner diameter between about 0.2 millimeter (mm) and about 0.3 mm, but other suitable diameters may be used in other exemplary embodiments.

Referring to FIG. 2E, the inlet diffuser 280 may include at least one tube 283. The tube 283 may include at least one opening 285. The inlet diffuser 280 show in FIG. 2E may be similar to the inlet diffuser shown in FIG. 2A. In some embodiments, each of the openings 285 may include a plurality of small openings (not shown), such that the gas such as nitrogen may be delivered at different angles. For example, the small openings (not shown) may be angled between about 0 and about 5 degrees above or below horizon, such that nitrogen may desirably dry top surfaces and bottom surfaces of the substrates 270 and/or the substrate holders 275. In other embodiments, each of the openings 285 may include a plurality of small openings (not shown) which are substantially disposed at the same level and angled at about 0, 45, 90 and 135 degrees.

Referring again to FIG. 2A, the pressure within the sealed carrier 200 may be maintained higher than the pressure of the environment surrounding the carrier 200 in order to prevent or reduce gas flowing from the environment into the carrier 200. For example, if the environmental pressure is about 1 atm, the pressure within the carrier 200 may be maintained higher than 1 atm. In some embodiments, the pressure within the carrier 200 may be maintained within a predetermined range, such as from about 1.0 atm to about 1.3 atm, preferably about 1.05 atm so as to maintain a pressure difference between the environment and the carrier 200 that will prevent explosion of the carrier 200.

The desired pressure may be maintained by the various aforementioned pressure control methods such as by providing a gas provided into the carrier 200 by the tank 230. The gas may comprise a reduction gas, a gas that is non-reactive with the substrate 270, e.g., nitrogen, helium, neon, argon, krypton, xenon, radon, or other gas or a mixture thereof.

Figure 3A:
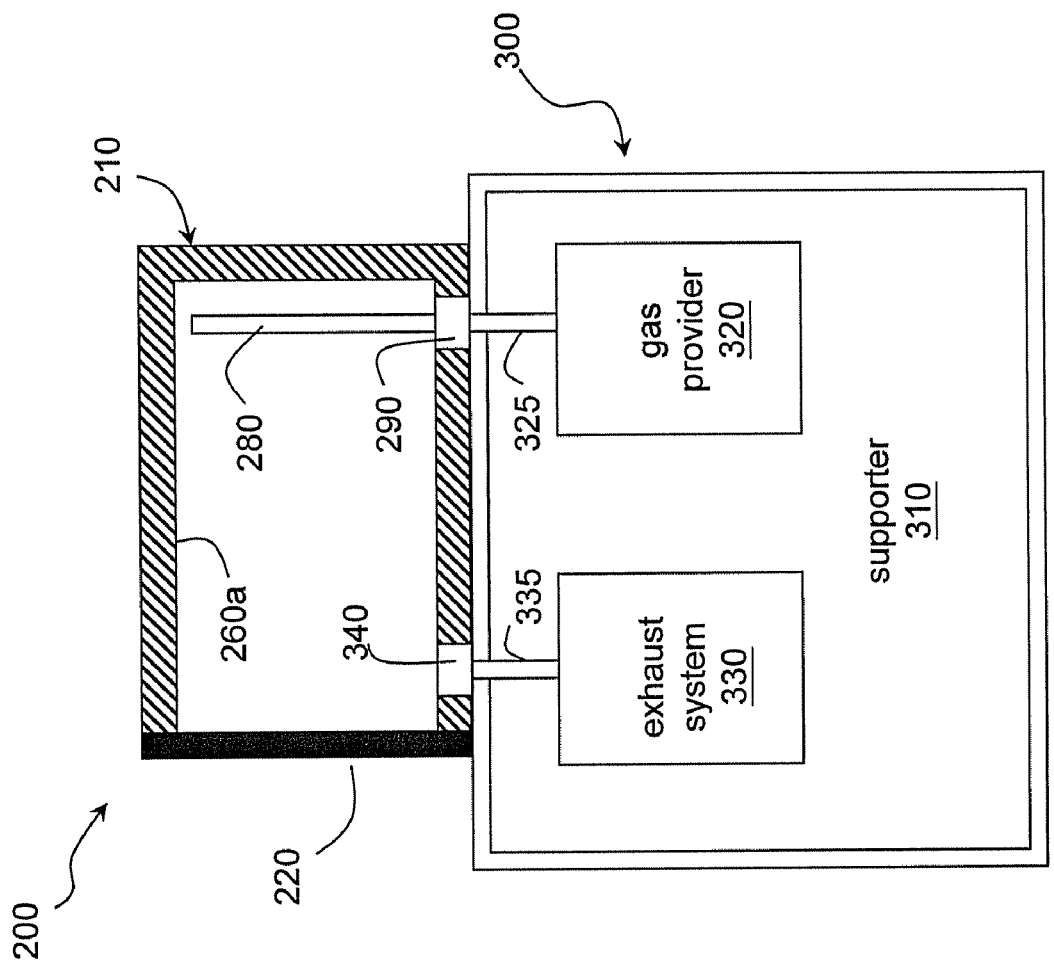
FIG. 3A is a schematic cross-sectional view showing a carrier disposed over an exemplary port apparatus.

FIG. 3A is a schematic cross-sectional view showing a carrier disposed over an exemplary port apparatus. Referring to FIG. 3A, the carrier 200, enclosure 210, door 220, inlet diffuser 280 and valve 290 are similar to the carrier 200, enclosure 210, door 220, inlet diffuser 280 and valve 290, respectively, described in conjunction with FIG. 2A. FIG. 3A shows that the door 220 seals the enclosure 210. The carrier 200 is disposed over a port apparatus 300. The port apparatus 300 may comprise an supporter 310, a gas provider 320 and an exhaust system 330. The gas provider 320 may be a gas delivery system. The gas provider 250 may be coupled to the enclosure 300. In some embodiments, the gas provider 320 may comprise a gas cabinet and/or a gas pipeline that is appropriate to provide a gas such as hot nitrogen. In other embodiments, the gas provider 320 may comprise a bulk special gas system (BSGS), a gas cabinet, a gas line, a gas tank, a compressor, or other apparatus that is adequate to provide a gas or various combinations thereof.

In some embodiments, when the carrier 200 is disposed over or otherwise in contact with the port apparatus 300, the valve 290 may be opened. The gas provider 320 then is operative to provide a gas, e.g., hot nitrogen, to the inlet diffuser 280 through the valve 290 and the tube or pipeline 325. The exhaust system 330 may be coupled to the supporter 310 via tube or pipeline 335. In some embodiments, the exhaust system 330 is coupled to a release valve 340 of the enclosure 210 when the enclosure 210 is disposed over the port apparatus 300. The exhaust system 330 may be operative to remove or exhaust a gas such as air, moisture, or other gas within the carrier 200 through the release valve 340 and the tube or pipeline 335. The exhaust system 330 may comprise, for example, a pump, vacuum system, engine, motor or other apparatus that is adequate to remove or exhaust the gas from the enclosure 210.

The configuration of the gas provider 320, the exhaust system 330, the tubes 325, 335 and the valve 340 are not limited by FIG. 3A. They can be coupled to any part or location of the supporter 310 suitable for the gas provider 320 to desirably provide a gas, e.g., hot nitrogen, and for the exhaust system 330 to exhaust the carrier 200.

Following are exemplary descriptions of the removal of moisture from the enclosure 210 by the port apparatus 300. For example, when the enclosure 210 is disposed over the port apparatus 300, the valves 290, 340 may be aligned to the tubes 325, 335, respectively. Then the valves 290, 340 may be opened. A gas, e.g., hot nitrogen, is provided from the gas provider 320 through the tube 325, the valve 290 and the inlet diffuser 280 into the carrier 200. The gas such as hot nitrogen have a temperature so as to expel and/or remove moisture and/or AMC from the top surfaces of the substrates 270 (shown in FIG. 2A), inside surfaces 260a of the enclosure 210 and/or the enclosure 210.

In some embodiments, the exhaust system 330 may be triggered while the gas provider 320 is turned on. The exhaust system 330 may be operative to exhaust the gas such as air, moisture, AMC, or other gas trapped in the carrier 200. Accordingly, the incorporation of injecting a gas such as hot nitrogen within the carrier 200 and exhausting moisture from the carrier 200 may achieve the moisture content in the carrier 200 at a desired level.

Figure 3B:
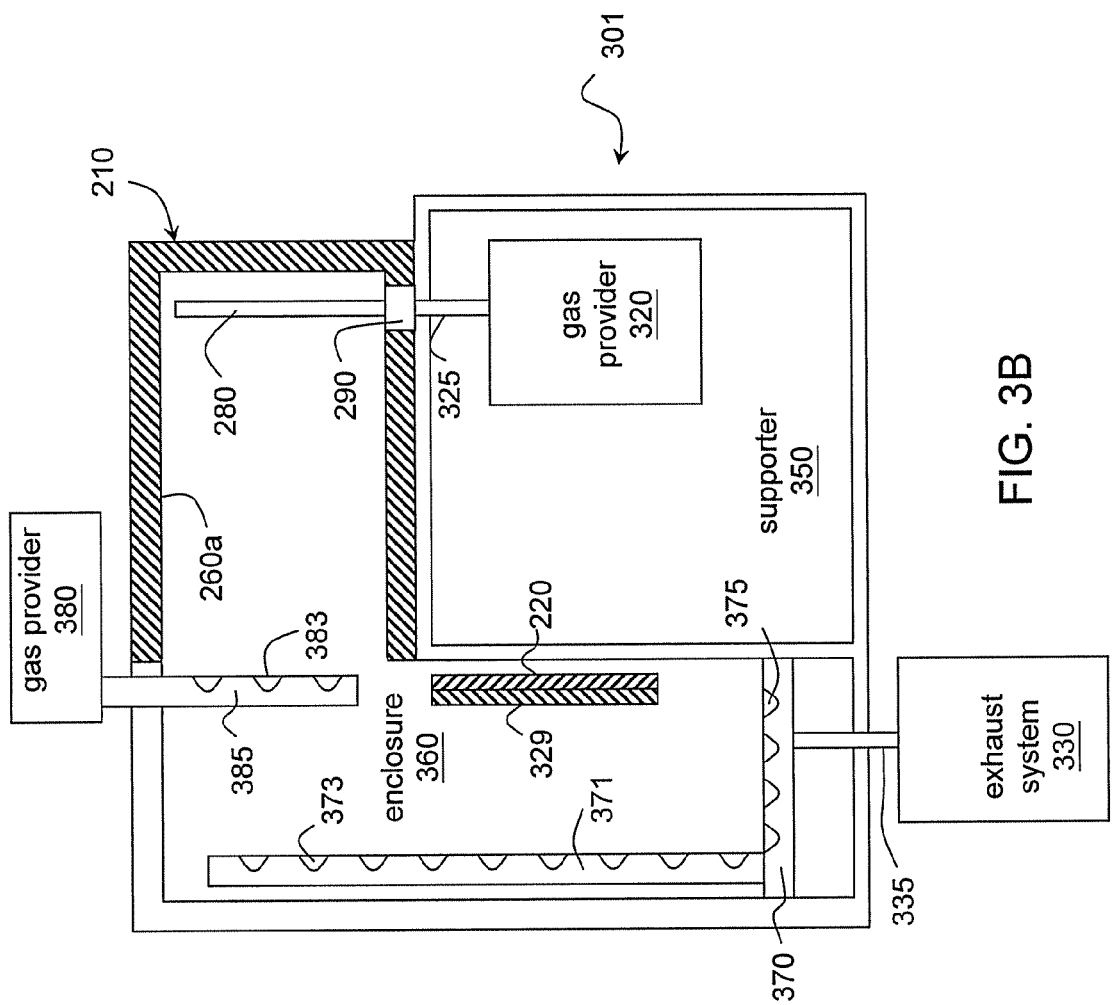
FIG. 3B is a schematic cross-sectional view showing a carrier disposed over another exemplary port apparatus.

FIG. 3B is a schematic cross-sectional view showing a carrier disposed over another exemplary port apparatus. Referring to FIG. 3B, the enclosure 210, inlet diffuser 280 and valve 290 are similar to the enclosure 210, inlet diffuser 280 and valve 290, respectively, described in FIG. 2A. FIG. 3B shows an embodiment in which the door 220 of the FOUP and a door 329 of an enclosure 360 are removed. With the door 220 removed, the enclosure 210 is disposed over a supporter 350 of a port apparatus 301 and is attached to the enclosure 360 of the port apparatus 301.

The port apparatus 301 may include enclosures 350, 360, a gas provider 320 and an exhaust system 330. The gas provider 320 may be coupled to the supporter 350. In some embodiments, with the enclosure 210 disposed over the supporter 350 of the port apparatus 301, the valve 290 is opened. The gas provider 320 may be operative to provide a gas, e.g., hot nitrogen, to the inlet diffuser 280 through the valve 290 and the tube or pipeline 325. The exhaust system 330 may be coupled to the enclosure 360. In some embodiments, the exhaust system 330 may be coupled to a tube 370 with at least one opening 375. The openings 375 may be round, triangular, square, rectangular, other shapes that are adequate to exhaust or remove a desired amount of gas from the enclosure 210 or combinations thereof. In some embodiments, another tube such as tube 371 is coupled to the tube 370. The tube 371 may have at least one opening such as openings 373 thereon. The configuration of the tubes 370 and 371 may desirably remove gas and/or moisture from the enclosures 210 and/or 360.

The exhaust system 330 may be operative to remove or exhaust a gas such as air, moisture, or other gas within the enclosure 210 through the enclosure 360, the tube 370 and the tube or pipeline 335. In some embodiments, the gas provider 320 may be a central gas cabinet or an apparatus that is appropriate to provide a gas such as hot nitrogen. The exhaust system 330 may be, for example, a pump, vacuum system, engine or other apparatus that is capable of removing gas from the enclosure 210.

The relative positions of the gas provider 320, the exhaust system 330 and the tubes 325, 335, 375 are not limited by the arrangement shown in FIG. 3B. They can be disposed at any part or region of the enclosures 350 and 360 as long as the gas provider 320 may desirably provide a gas, e.g., hot nitrogen into the enclosure 210, and the exhaust system 330 may desirably remove moisture from the enclosure 210.

Following are exemplary descriptions of the removal of moisture from the enclosure 210 by the port apparatus 301. For example, when the valve 290 is aligned to the tube 325, the enclosure 210 may be disposed over the supporter 350 of the port apparatus 301. The valve 290 is then opened. A gas, e.g., hot nitrogen, is provided from the gas provider 320 through the tube 325, the valve 290 and the inlet diffuser 280 and into the enclosure 210. The gas such as hot nitrogen have a temperature so as to expel moisture and/or dry from the top surfaces of the substrates 270 (shown in FIG. 2A), inside surfaces 260a of the enclosure 210 and/or the enclosure 210.

In some embodiments, the exhaust system 330 may be triggered while the gas provider 320 is turned on. The exhaust system 330 may remove or exhaust a gas such as air, moisture, or other gas from the enclosure 210. The injection of a gas such as hot nitrogen into the enclosure 210 and removal of moisture from the enclosure 210 may achieve the moisture level in the enclosure 210 at a desired level.

In some embodiments, the port apparatus 301 may desirably remove or exhaust moisture from the enclosure 210 if the enclosure 210 is a brand new enclosure or an enclosure that has been exposed to atmosphere for a while such that moisture has accumulated inside of the enclosure 210. For enclosures long exposed to the environment, moisture may be present in the enclosures and may be absorbed by the material of the inside walls of the enclosures. In order to desirably remove the moisture from the enclosure 210, the door 220 (shown in FIG. 2A) is removed, and the opening (not labeled) of the enclosure 210 is aligned to the opening (not labeled) of the enclosure 360. The enclosures 210 and 360 are attached to each other so as to seal the enclosure 210. Since the door (not shown) is removed, the moisture within the enclosure 210 may be desirably removed through the wide opening of the enclosure 210, the enclosure 360 and the tube 370 by the exhaust system 330.

Referring again to FIG. 3B, the port apparatus 301 may include a gas provider 380 configured to provide a gas, e.g., hot nitrogen, into the enclosure 210 so as to remove moisture therein. The gas provider 380 may be coupled to an inlet diffuser which may include a tube 385 having at least one opening such as openings 383 thereon. The gas provider 380 may provide hot nitrogen through the tube 385 and openings 383 into the enclosures 210 and/or 360.

Figure 3C:
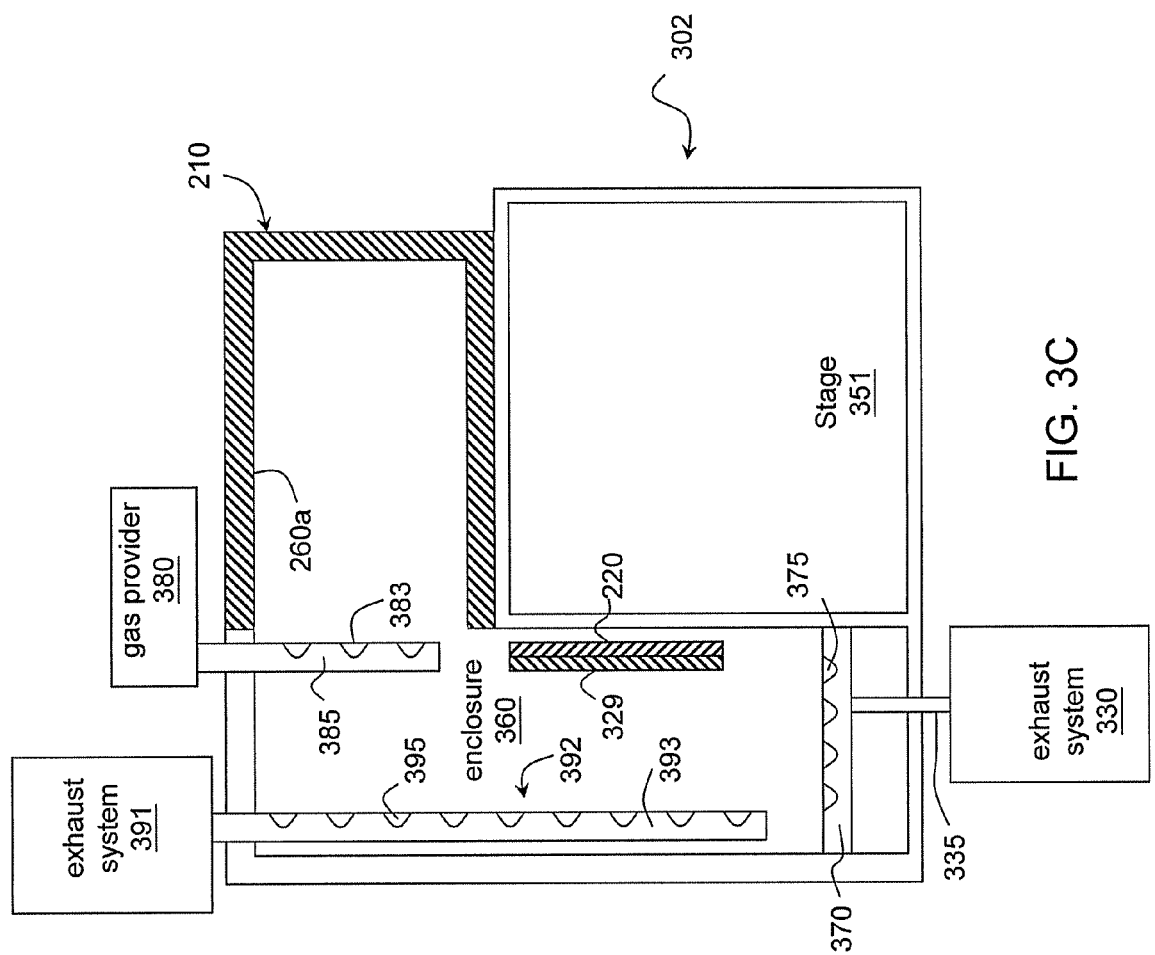
FIG. 3C is a schematic cross-sectional view showing another carrier disposed over another exemplary port apparatus.
Figure 3D:
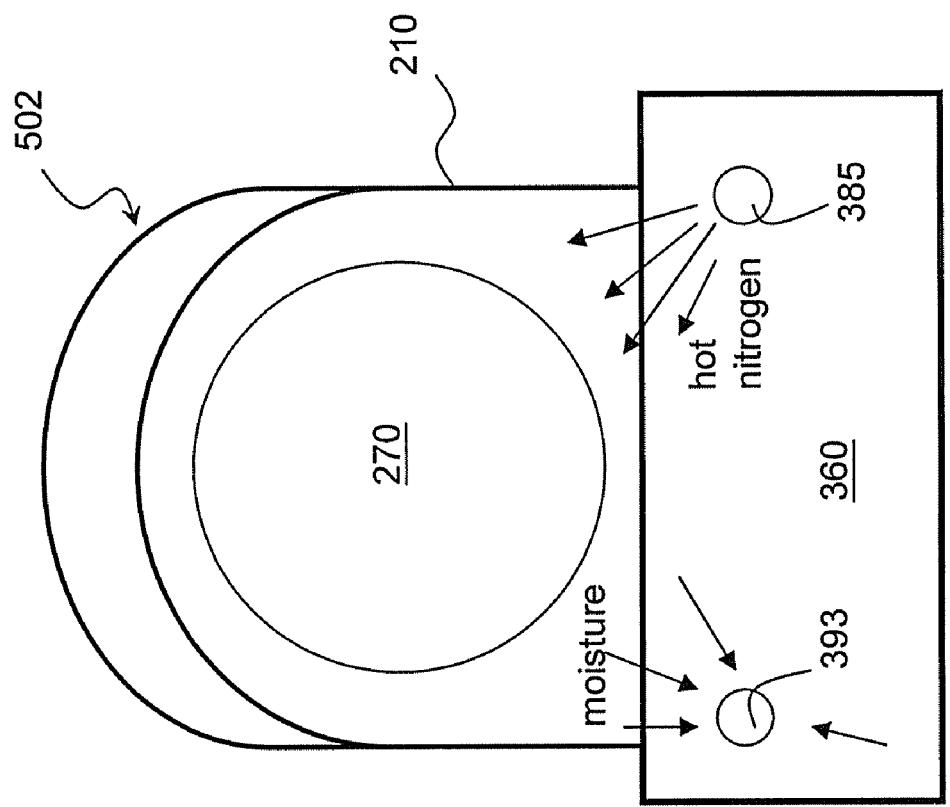
FIG. 3D is a perspective top view of the port apparatus of FIG. 3C.

FIG. 3C is a schematic cross-sectional view showing another carrier disposed over another exemplary port apparatus; FIG. 3D is a perspective top view of the port apparatus of FIG. 3C. In FIGS. 3C and 3D, like items are indicated by like reference numbers as in FIG. 3B. Referring to FIG. 3C, a port apparatus 302 may comprise a stage 351 and enclosure 360. The stage 351 is configured to support the enclosure 210. Another exhaust system 391 may be coupled to the enclosure 360. In some embodiments, the exhaust system 391 may be coupled to an outlet diffuser 392. The outlet diffuser 292 may comprise a tube 393 having at least one opening such as openings 395 thereon. The outlet diffuser 392 may be configured to remove gas and/or moisture from the enclosures 210 and/or 360 through the openings 297.

In the embodiments shown in FIG. 3C, the exhaust systems 330 and/or 391 and the gas provider 380 may provide a desired moisture level within the enclosure 210 in which the substrates 270 (shown in FIG. 3D) are disposed. In addition, the sealant apparatus 215 described in conjunction with FIG. 2A may desirably seal the enclosure 210 after the door 220 is transferred to seal the enclosure 210. Accordingly, the inlet diffuser 280, the outlet diffuser 293 and/or the tank 230 (shown in FIG. 2A) may be omitted.

Figure 3E:
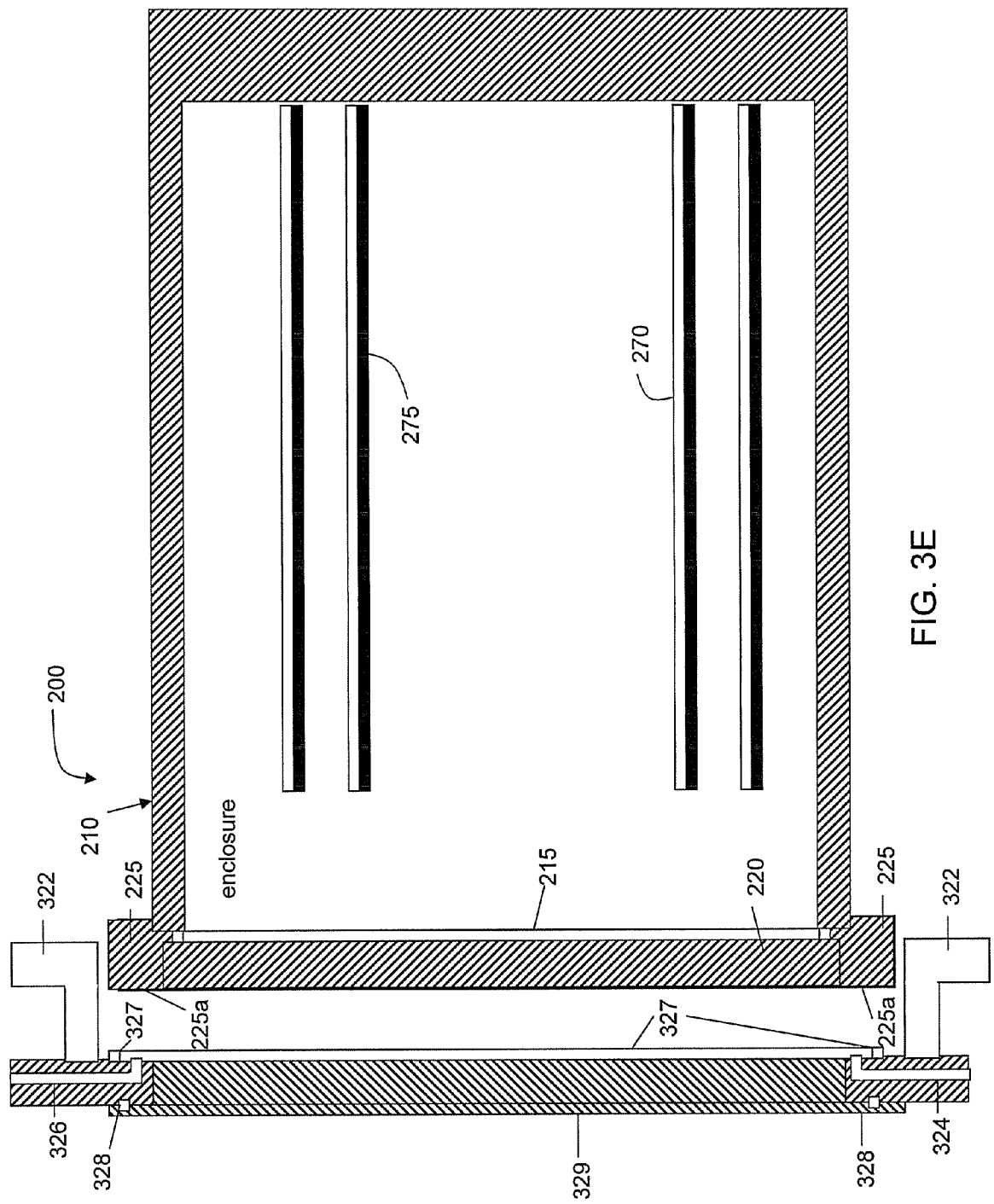
FIGS. 3E-3G are schematic cross-sectional views illustrating an exemplary process of attaching an exemplary carrier to an exemplary port apparatus.
Figure 3F:
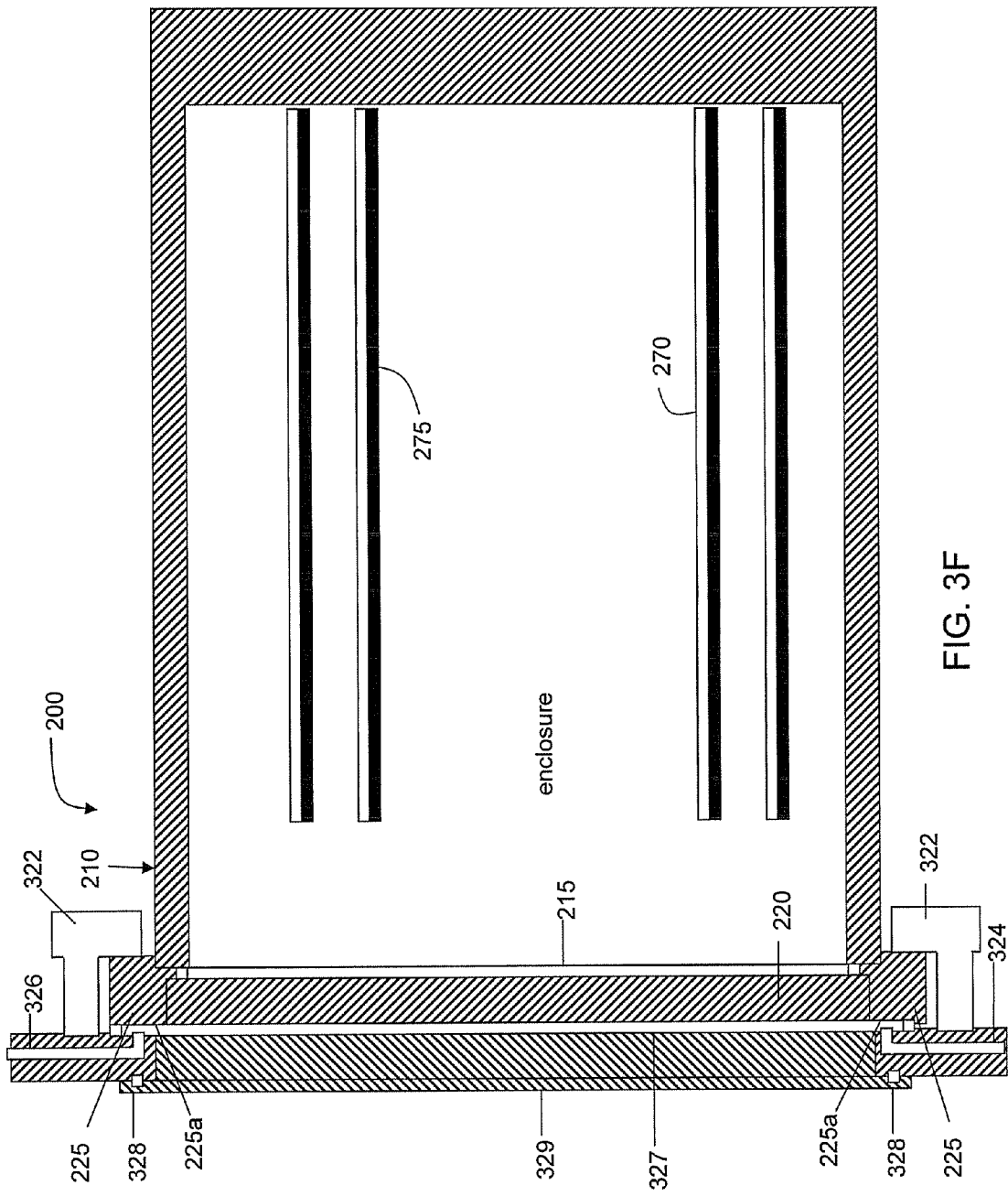
Figure 3G:
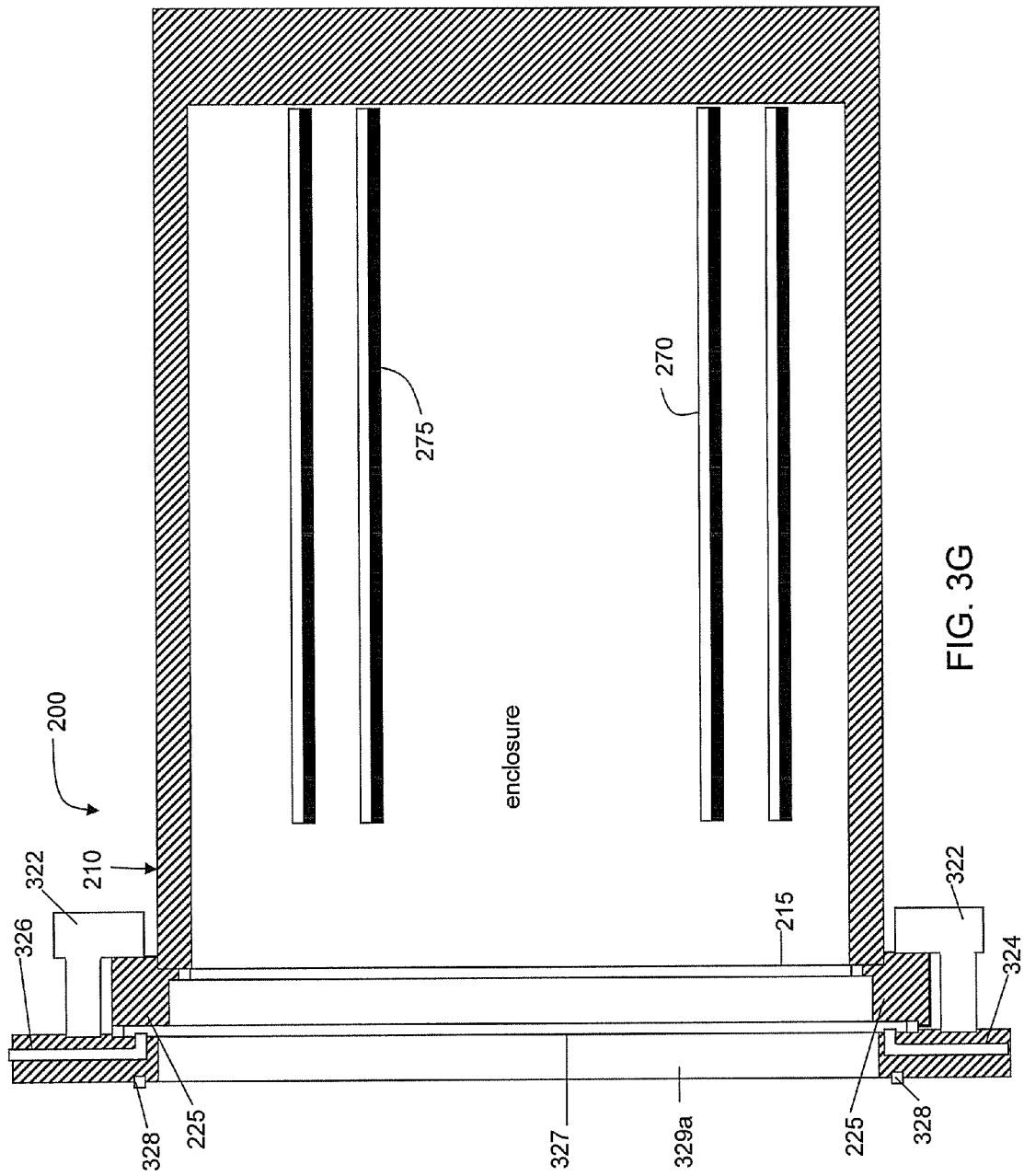

FIGS. 3E-3G are schematic cross-sectional views illustrating an exemplary process of attaching the carrier 200 to the port apparatus 502 as shown in FIG. 3C.

Referring to FIG. 3E, the carrier 200 is moved approached to a wall (not labeled) of the enclosure 360. The wall of the enclosure 360 includes a door 329, which is configured to cover an opening into the enclosure 360. A sealing apparatus 328, such as a rubber strip, O-ring, gel or other apparatus adapted to seal the enclosure 360, is disposed on the inner surface of the wall (not labeled) of the enclosure 360 and between the wall (not labeled) and the door 329 so that the door 329 can be attached to the wall (not labeled) to tightly seal the enclosure 316. In some embodiments, the sealing apparatus 328 is disposed on the door 326 at the periphery area surrounding the opening 329a (shown in FIG. 3G). The outer surface of the wall (not labeled) of the enclosure 360 includes another sealing apparatus 327, such as a rubber strip, O-ring, gel or other apparatus adapted to seal the region between the doors 220 and 329 after the attachment of the carrier 200 and the wall of the enclosure 360. The sealing apparatus 327 is adapted to seal the gap between the frame 225 of the carrier 200 to the wall of the enclosure, when the door 220 is attached to the wall 310a as shown in FIG. 3F. In some embodiments, the sealing apparatus 327 is disposed on the surface 225a of the frame 225 surrounding the opening 329a (show in FIG. 3G).

At least one fasteners 322, such as clamps, knob clamps, clips or other devices that can fasten the carrier 200 to the wall of the enclosure 360, are configured on the outer surface of the wall of the enclosure 360 proximate to edges of the sealing apparatus 327 to fasten the carrier 200, such as the frame 225. The fasteners 322 can be, for example, rotated or vertically moved to fasten the carrier 200. The number of the fasteners 322 is not limited to the number shown in FIG. 3E. It can be one or more than one fasteners 322 as long as the carrier 200 can be fastened to the wall of the enclosure 360.

At least one valves, such as a valve 324 and a valve 326, configured within the wall of the enclosure 360. The opening of the valves 324 and 326 are configured within an area enclosed by the sealing apparatus 327 to remove air and/or moisture from a region sealed by the sealing apparatus 327 as shown in FIG. 3F and inject at least one of inert gas, hot nitrogen or a mixture thereof into the region, respectively. In some embodiments, only one of the valves 324 and 326 is used if the selected valve is configured to allow both the removal of the air from the region sealed by the sealing apparatus 327 and the injection of an inert gas or a mixture gas including the reduction gas into the region. In some embodiments, the valves 324 and/or 326 are coupled to at least one mass flow controllers (MFC) to control the removal rate of air and the injection rate of the inert gas or the mixture gas.

Referring to FIG. 3F, the carrier 200 is attached to the wall enclosure 360, such as the sealing apparatus 327. Under this embodiment, the surface 225a of the frame 225 is attached against the sealing apparatus 327 so that the sealing apparatus tightly seals the gap between the doors 215 and 329. The valve 324 then removes air trapped within the region sealed by the sealing apparatus 327. The valve 326 then injects at least one of the inert gas, hot nitrogen or a mixture gas thereof into the sealed region so as to desirably remove moisture therein. In some embodiments, the cycle of the removal of the air and the injection of the inert gas, hot nitrogen or mixture gas is performed at least one times, such as about 3-5 times, so that the air trapped within this region sealed by the sealing apparatus 327 is substantially removed.

Referring to FIG. 3G, the doors 329 and 220 are sequentially removed to locations that will not interfere the transfer of the substrates 270. The locations can be, for example, proximate to the inner surface of the wall of the enclosure 360 and below the opening 329a that is covered by the door 329. In addition, the dimension of the door 220 may be smaller than that of the door 329. The door 220 thus can be removed towards the enclosure 360 after the removal of the door 329. As described above, the enclosure 360 and the carrier 200 contain the gas including the reduction gas. Further, the air trapped within the region sealed by the sealing apparatus 327 and the inert gas, hot nitrogen or a mixture gas thereof is then injected into this region. The present invention, however, is not limited thereto.

Figure 4A:
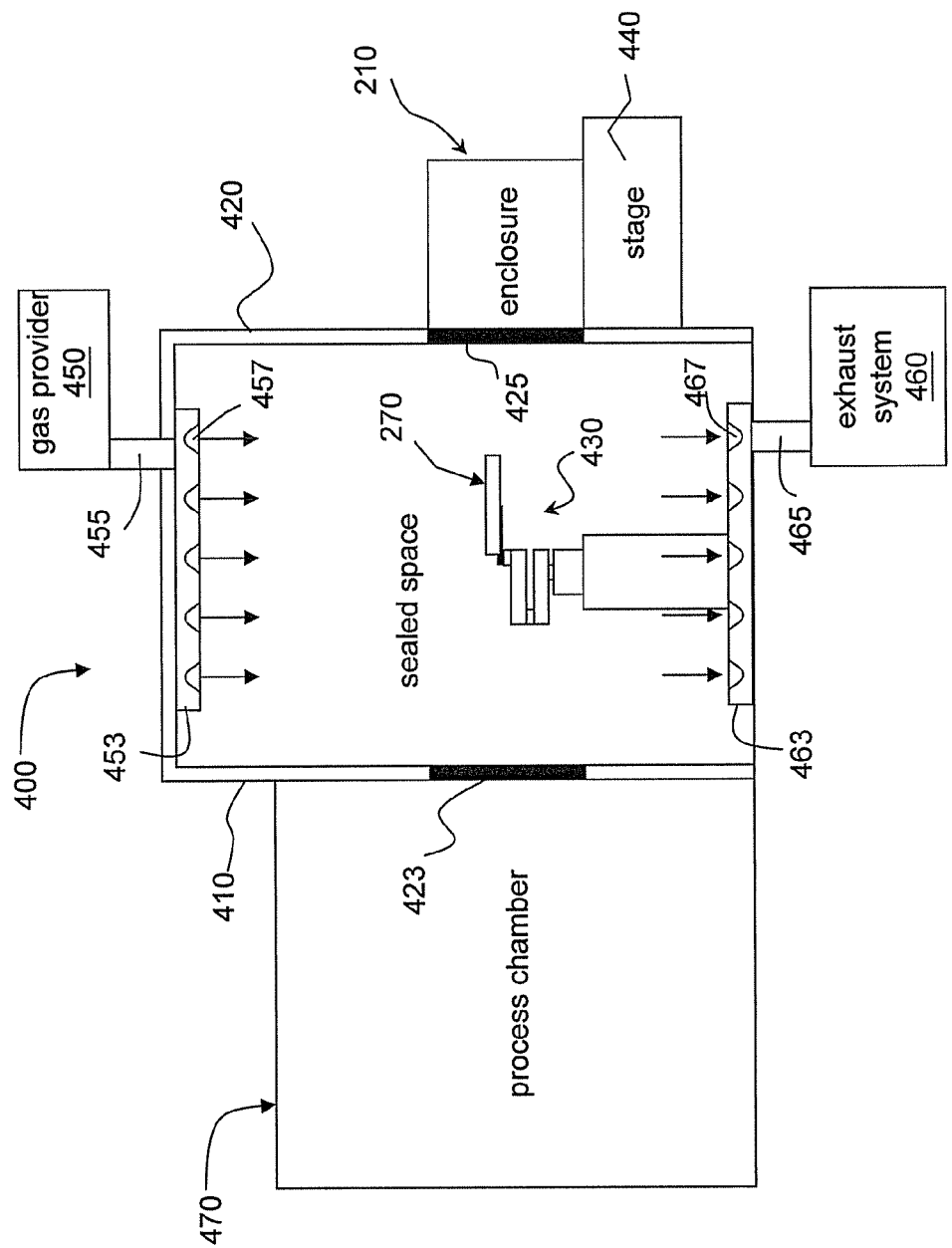
FIG. 4A is a schematic cross-sectional view of an exemplary facility interface system.

FIG. 4A is a schematic cross-sectional view of an exemplary facility interface system. Referring to FIG. 4A, the facility interface system 400 may comprise an enclosure 410. The enclosure 410 may include a sealed space having a gas therein and at least one door 425 on or in at least one of the walls 420 of the enclosure 410. The gas may comprise air, moisture or other gas. At least one robot such as robot 430 is disposed within the enclosure 410. At least one stage such as stage 440 is disposed outside of the space and on or proximate to an outer surface of one of the walls 420 of the enclosure 410 proximate to the door 425 for supporting the enclosure 210. Optionally, the enclosure 210 can be directly coupled to and be supported by the wall 420 of the enclosure 410. The door 425 is provided so that the substrates 270 stored in the enclosure 210 can be properly transferred between the enclosure 210 and the facility interface 400. The robot 430 operates to transfer the substrate 270 to and from the enclosure 210 and the process chamber 470 through the doors 425 and 423, respectively. The enclosure 210 and substrate 270 may be as those described in conjunction with FIG. 2A.

In some embodiments, the facility interface 400 is as described in, for example, commonly assigned and copending U.S. patent application Ser. No. 11/419,933, filed on May 23, 2006, the entirety of which is hereby incorporated by reference herein.

In some embodiments, the enclosure 410 is connected to a process or transfer chamber 470. A process chamber 470 can be, for example, a wet chemical plating bench, a dry etch chamber for via etching, a chamber for formation of a copper seed layer, a chamber for copper or other chemical mechanical polishing (CMP), a chamber for formation of low-k dielectric material or another chamber which forms or exposes material on the substrate that may react if exposed to the environment.

In some embodiments, the enclosure 410 may comprise a gas provider 450 and an exhaust system 460. The gas provider 450 is coupled to the enclosure 400. In some embodiments, the gas provider 450 is disposed at the top region of the enclosure 410. The gas provider 450 may be configured to provide the gas, e.g., hot nitrogen, to the enclosure 410 through the tube or pipeline 455 and the tube 453. The tube 453 may comprise at least one opening 457 through which the gas, e.g., hot nitrogen, is provided into the enclosure 410. In some embodiments, the openings 457 may be round, triangular, square, rectangular, other shapes that are adequate to provide a desired amount of gas into the enclosure 410 or combinations thereof.

The exhaust system 460 is coupled to the enclosure 410. In some embodiments, the exhaust system 460 may be disposed at the bottom region of the enclosure 410. The exhaust system 460 may be configured to remove or exhaust a gas such as air, moisture, AMC, or other gas from the enclosure 410 through the tube or pipeline 465 and the tube 463. The tube 463 may comprise at least one opening 467 through which the gas is exhausted. The openings 467 may be round, triangular, square, rectangular, other shapes that are adequate to exhaust a desired amount of gas from the enclosure 410. In some embodiments, the gas provider 450 may comprise a central gas cabinet or an apparatus that is appropriate to provide a gas such as hot nitrogen. The exhaust system 460 may comprise, for example, a pump, vacuum system, engine, motor or other apparatus that is adequate to remove a gas from the enclosure 410.

In some embodiments, when the gas provider 450 provides a gas, e.g., hot nitrogen, into the enclosure 410, the exhaust system 460 may operate simultaneously. The exhaust system 460 removes the gas such as air, moisture, or other gas from the enclosure 410. The feature of injecting a gas such as hot nitrogen into the enclosure 410 and removing moisture from the enclosure 410 may maintain moisture level in the enclosure 410 at a desired level.

The relative positions of the gas provider 450, the exhaust system 460 and the tubes 453, 463 are not limited by the configuration illustrate in FIG. 4A. They can be disposed at any part or region of the enclosure 410 as long as the gas provider 450 may desirably provide a gas, e.g., hot nitrogen into the enclosure 410, and the exhaust system 460 may desirably remove moisture from the enclosure 410.

Based on the foregoing, the sealing apparatus 215 described above in FIG. 2B may desirably seal the enclosure 210. The PTFE "TEFLON®" or PFA "TEFLON®" enclosure 210 may be applied such that the moisture level within the enclosure 210 may be desirably achieved. The inlet diffuser 280 (shown in FIGS. 2A-2E) may desirably provide a gas, e.g., hot nitrogen, into the enclosure 210 to expel moisture and/or dry portions of the enclosure 210 after the enclosure 210 is loaded upon the port apparatus 300 or 301 (shown in FIGS. 3A and 3B). The exhaust system 330 may desirably exhaust moisture from the enclosure 210. Further, the gas provider 450 and the exhaust system 460 (shown in FIG. 4A) may desirably remove moisture from the enclosure 410 while the substrate 270 is transferred between the enclosures 210 and 410. Accordingly, the potential for of interaction of moisture and metallic layers and/or low-k dielectric layers may be desirably reduced.

Figure 4B:
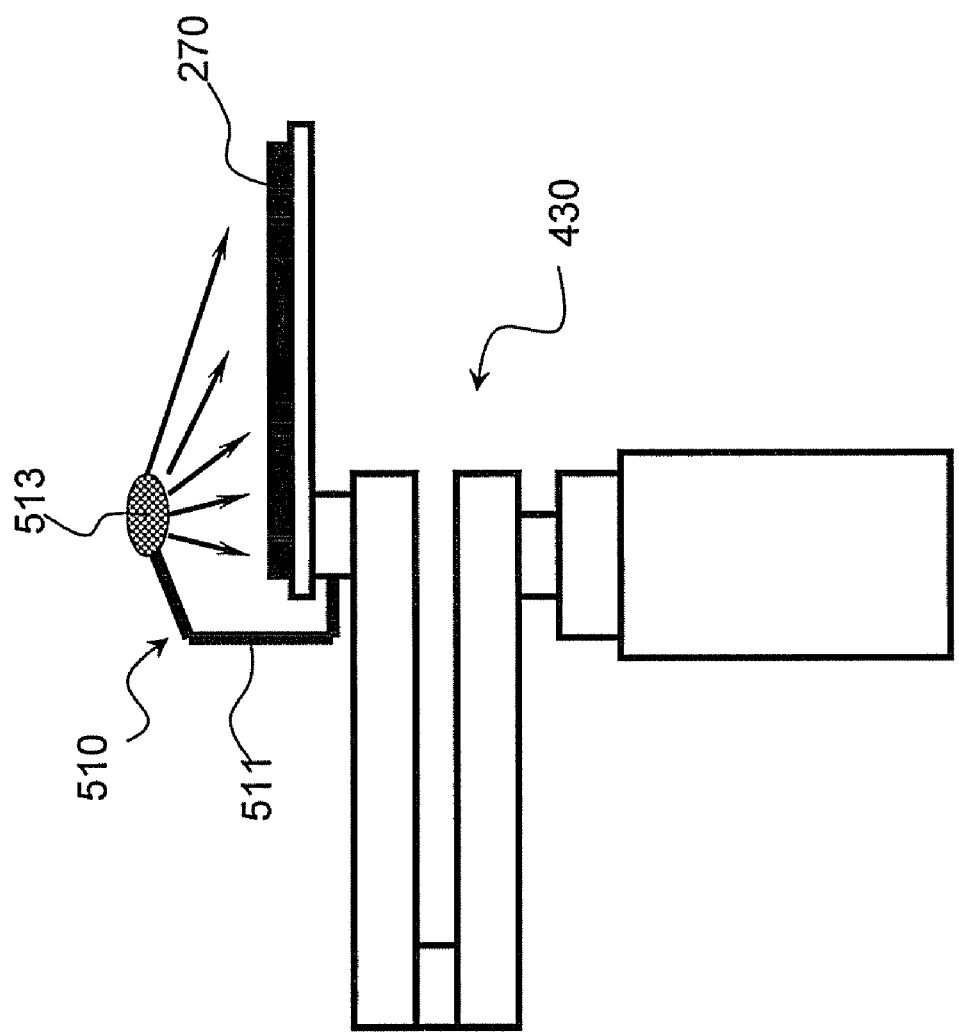
FIG. 4B is a schematic cross-sectional view of an exemplary robot system.

FIG. 4B is a schematic cross-sectional view of an exemplary robot system. In FIG. 4B, like items are indicated by the like reference numbers as in FIG. 4A. A gas providing apparatus 510 may be coupled to the robot 430. In some embodiments, the gas providing apparatus 510 may be configured to provide a gas, e.g., hot nitrogen, to the surface of the substrate 270 so as to remove moisture from and/or dry the substrate 270. In some embodiment, the gas providing apparatus 510 may comprise an arm 511 and a head 513. The arm 511 may be coupled to a central gas cabinet such that hot nitrogen can be desirably delivered through the arm 513. In some embodiments, the head 513 may include at least one opening (not shown) through which hot nitrogen can be desirably delivered to the surface of the substrate 270 so as to dry the substrate 270.

In some embodiments, the gas providing apparatus 510 may be operative to dry the substrate 270 at desired locations. For example, while the substrate 270 is transferred from or to the enclosure 210, while the substrate 270 is transferred from or to an orienter or an aligner, or while the substrate 270 is to be delivered into or from a process chamber, the gas providing apparatus 510 may desirably dry the substrate 270 during the transfer of the substrate 270. In this embodiment, the gas providing apparatus 510 dries the substrate 270 during the transfer of the substrate 270. The amount of gas such as hot nitrogen can be desirably used. In some embodiments, the gas providing apparatus 453 may be disposed close to the doors 425 and/or 423 (shown in FIG. 4A) and/or the orienter or the aligner (not shown) so as to desirably dry the substrate 270 when the substrate 270 is transferred to the locations within the enclosure 410. In this embodiment, the gas providing apparatus 453 may be triggered so as to desirably dry the substrate 270 at the locations and the amount of the hot nitrogen can be desirably used.

Based on the foregoing, the moisture level within the enclosure 210 and the facility interface system 400 can be desirably maintained by using the apparatuses described in conjunction with FIGS. 2A-2D, 3A-3D and 4A-4B. Accordingly, a global cluster system with a desired moisture level can be achieved.

In some embodiments, the facility interface system 400 may include a fan filter unit (FFU) or a clean unit (not shown). The FFU or clean unit may configured within the facility interface system 400 so as to remove particles therefrom. In some embodiments, the FFU or clean unit may comprise a particle filter, at least one fan/blower and/or at least one diffuser (not shown). The particle filter may be configured to remove or trap particles within the facility interface system 400. The fan and/or diffuser may circulate the gas within the facility interface system 400 such that the gas bringing the particles flows through the particle filter and the particles are trapped by the particle filter.

Figure 5:
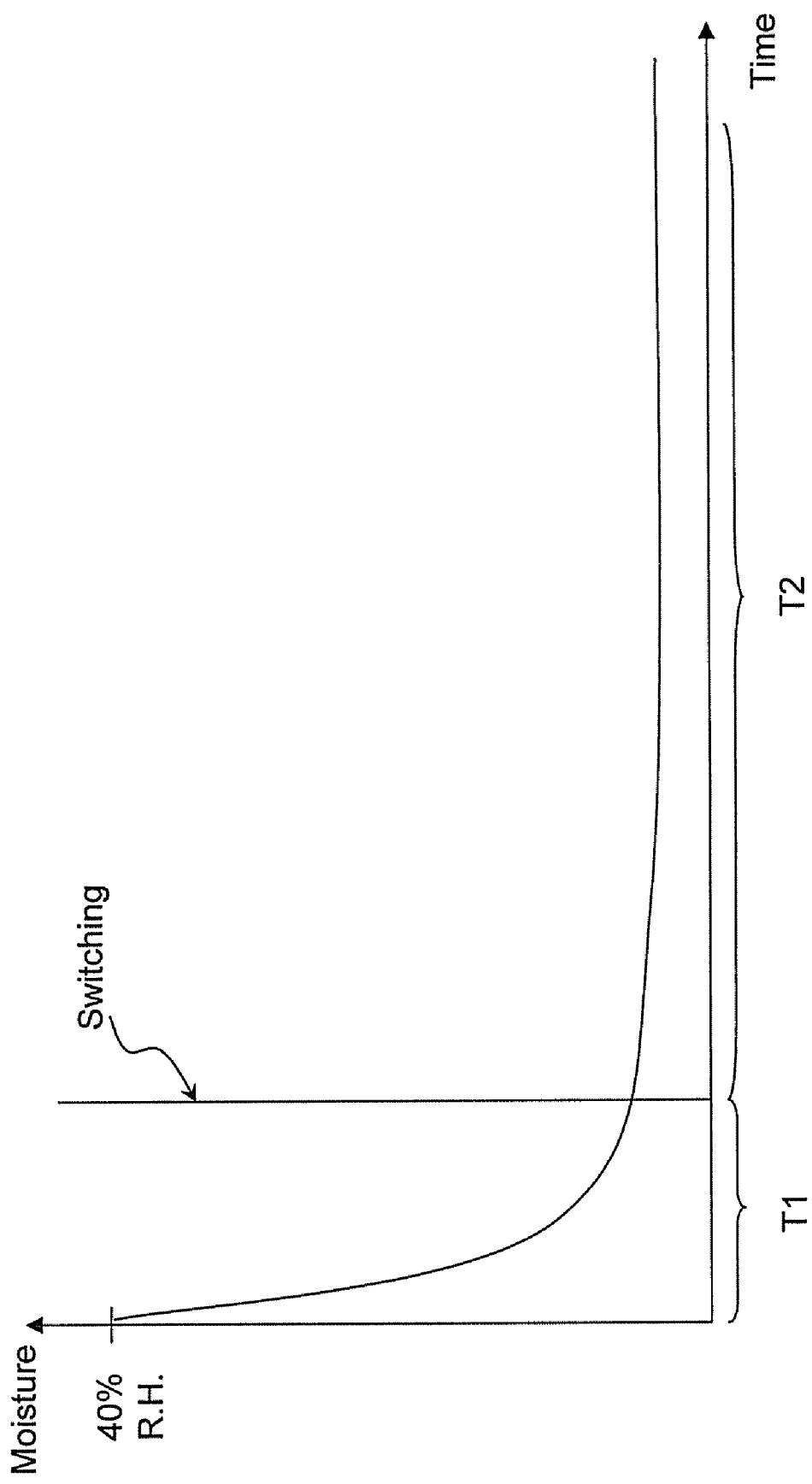
FIG. 5 is a graphical illustration showing a theoretical relationship between moisture level and time.

FIG. 5 is a schematic drawing showing a theoretical relationship between moisture level and time. Referring to FIG. 5, the horizontal axis has two time periods: T1 and T2. During the time period T1, moisture within the enclosure 210 is removed by the port apparatus 300 or 301 shown in FIGS. 3A-3B. For example, the original enclosure 210 may be exposed to atmosphere and have a relative humidity of about 40%. After the moisture-containing enclosure 210 is disposed on the port apparatus 300 or 301, the gas provider 320 provides a gas, e.g., hot nitrogen into the enclosure 210, and the exhaust system 330 removes moisture from the enclosure 210 so as to desirably reduce the level of moisture within the enclosure 210 to parts per million (ppm) level. After the desired moisture level is achieved, the operations of the gas provider 320 and the exhaust system 330 may be turned down to a small flowing rate. For example, the gas provider 320 may provide a smaller flow of purging-nitrogen into the enclosure 210. The purging nitrogen may maintain the moisture at a desired ppm level. In some embodiments, when the door 220 is configured to close the enclosure 210, the moisture within enclosure 210 still may be maintained at a desired level, such as 1% after 24 hours. The sealed enclosure 210 may be transferred to facility interface (FI) for a subsequent process. During this period, the moisture level within the sealed enclosure 210 may be maintained within the desired level, such as at a ppm level. In other embodiments, a desired moisture level may be maintained within the sealed enclosure 210, such as at a ppm level after 72 hours. In some embodiments, the needle valve 240 of the tank 230 may be switched on if the moisture level within the sealed enclosure 210 should be maintained at a more desired ppm level. The tank 230 (shown in FIG. 2A) may deliver a desired amount of nitrogen into the sealed enclosure 210 to maintain this desired pressure and moisture level therein.

During the time period T2, the gas providers 320, 380 and the exhaust system 330 are turned down to a small flowing rate. When the door 220 is operative to seal the enclosure 210, a triggering signal may be transmitted to the tank 230 (shown in FIG. 2A) disposed within the enclosure 210. The triggering signal may turn on the tank 230 to release a gas, e.g., nitrogen, into the enclosure 210 through the needle valve 240 (shown in FIG. 2A) during the time period T2. The released gas from the needle valve 240 may maintain pressure and/or moisture in the enclosure 210 at a desired level. The enclosure 210 sealed by the door 220 may be unloaded from the port apparatus 300 or 301 and transferred to a processing apparatus such as a CMP machine. Since the moisture level within the enclosure 210 is desirably controlled, the exposure of the metallic layers, low-k dielectric layer or other moisture-reactive material to moisture can be desirably reduced. Accordingly, the control of "Q-Time" during the manufacturing process may be desirably released.

In some embodiments, if the sealing apparatus 215 described above in FIG. 2B desirably seals the enclosure 210 and the PTFE "TEFLON®" or PFA "TEFLON®" enclosure 210 is used, the risk of moisture flowing into the enclosure 210 is desirably reduced. Since the enclosure 210 may be desirably sealed after the process described in FIGS. 3A and 3B, the use of the tank 230 may be omitted. Accordingly, after the time period T1 the moisture level within the enclosure 210 may be desirably maintained without use of the tank 230. After the desired moisture level is achieved, the operations of the gas provider 320 and the exhaust system 330 may be turned down to a small flowing rate. For example, the gas provider 320 and/or 380 may provide a smaller flow of purging-nitrogen into the enclosure 210. The purging nitrogen may maintain the moisture at a desired ppm level. In some embodiments, when the door 220 is configured to close the enclosure 210, the moisture within enclosure 210 still may be maintained at a desired level, such as 1% after 24 hours. The sealed enclosure 210 may be transferred to facility interface (FI) for a subsequent process. During this period, the moisture level within the sealed enclosure 210 may be maintained within the desired level, such as at a ppm level. In other embodiments, a desired moisture level may be maintained within the sealed enclosure 210, such as at a ppm level after 72 hours. In some embodiments, the needle valve 240 of the tank 230 may be switched on if the moisture level within the sealed enclosure 210 should be maintained at a more desired ppm level. The tank 230 (shown in FIG. 2A) may deliver a desired amount of nitrogen into the sealed enclosure 210 to maintain this desired pressure and moisture level therein.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. An apparatus, comprising:
a first enclosure with a first opening;
a first door configured to seal the first opening;
at least one first valve coupled to the first enclosure;
at least one inlet diffuser coupled to the first valve, the inlet diffuser configured to provide a first gas;
at least one substrate holder disposed within the first enclosure to support at least one substrate; and
a tank coupled to the first enclosure, the tank comprising at least one second valve and containing at least one fluid.

2. The apparatus of claim 1, wherein the inlet diffuser comprises at least one tube having at least one second opening such that the first gas is capable of being provided through the second opening.

3. The apparatus of claim 2, wherein the at least one substrate holder comprises two adjacent substrate holders, the at least one second opening comprises two adjacent second openings, and a distance between the two adjacent second openings is substantially equal to a distance between the two adjacent substrate holders.

4. The apparatus of claim 2, wherein the second opening has a dimension between about 0.2 millimeter (mm) and about 0.3 mm.

5. The apparatus of claim 1, wherein the temperature of the first gas is between about 70° C. and about 80° C.

6. The apparatus of claim 1, wherein the first gas comprises at least one of nitrogen, helium, neon, argon, krypton, xenon and radon.

7. The apparatus of claim 1, wherein at least a portion of the first enclosure comprises at least one of polytetrafluoroethylene (PTFE) and perfluoroalkoxy (PFA).

8. The apparatus of claim 1 further comprising a sealing apparatus disposed between the first enclosure and the first door, wherein the sealing apparatus is disposed around the first opening and includes a material comprising vinyl-functional polysiloxane, fumed silica and platinum compound.

9. The apparatus of claim 1, wherein the fluid comprises at least one of a second gas or a liquid of at least one of nitrogen ($N_2$), hydrogen ($H_2$) and ammonia ($NH_3$).

10. An apparatus, comprising:
a first enclosure having a first opening;
a first door configured to seal the first opening;
at least one first valve coupled to the first enclosure;
at least one inlet diffuser coupled to the first valve, the inlet diffuser configured to provide a first gas;
at least one substrate holder disposed within the first enclosure to support at least one substrate;
a port apparatus coupled to the first enclosure, the port apparatus configured to provide the first gas to the inlet diffuser, the port apparatus comprising:
a second enclosure;
a gas provider coupled to the second enclosure, the gas provider configured to provide the first gas to the inlet diffuser through the first valve; and
an exhaust system coupled to the second enclosure, the exhaust system configured to exhaust a second gas from the first enclosure.

11. The apparatus of claim 10, wherein the first enclosure further comprises a second valve through which the exhaust system is capable of exhausting the second gas from the first enclosure.

12. The apparatus of claim 10, wherein the first enclosure further comprises a second valve through which the exhaust system is capable of exhausting the second gas from the first enclosure.

13. The apparatus of claim 10, wherein a pressure within the first enclosure is about 1.05 atmosphere or more when the first door seals the first opening.

14. The apparatus of claim 10 wherein the second enclosure is coupled to a stage upon which the first enclosure is disposed, the second enclosure comprising:
   a second door configured to seal a second opening of the second enclosure; and
   a robot disposed within the second enclosure and configured to transfer a substrate between the first enclosure and the second enclosure,
   wherein the gas provider and the exhaust system are included in the second enclosure.

15. The apparatus of claim 14 further comprising:
   an arm disposed to the robot; and
   a head disposed at one end of the arm, wherein the head is configured to provide a third gas to dry the substrate.

16. The apparatus of claim 14, wherein the second enclosure further comprises:
   a first tube coupled to the gas provider and disposed at a top region of the second enclosure, the first tube comprising at least one third opening to provide a third gas with a temperature substantially higher than a temperature of an environment around the second enclosure; and
   a second tube coupled to the exhaust system and disposed at a bottom region of the second enclosure, the second tube comprising at least one fourth opening to exhaust a fourth gas from the second enclosure.

17. The apparatus of claim 16, wherein the temperature of the third gas is between about 70° C. and about 80° C.

18. The apparatus of claim 16, wherein the third gas comprises at least one of nitrogen, helium, neon, argon, krypton, xenon and radon.

19. The apparatus of claim 10, wherein the port apparatus further comprises:
   at least one fastener disposed on a sidewall of the port apparatus and configured to fasten a frame of the first enclosure;
   at least one sealant apparatus configured to contact a surface of the frame of the first enclosure; and
   at least one second valve configured to exhaust moisture between the port apparatus and the first enclosure when the at least one sealant apparatus contacts the surface of the frame of the first enclosure.

20. An apparatus, comprising:
   an enclosure having a first opening, wherein at least part of the enclosure comprises a material comprising at least one of polytetrafluoroethylene (PTFE) and perfluoroalkoxy (PFA);
   a door configured to seal the first opening;
   at least one first valve coupled to the first enclosure;
   at least one tube having at least one second opening and coupled to the first valve, the tube configured to provide nitrogen with a temperature substantially higher than a temperature of the environment around the enclosure;
   a tank coupled to the enclosure, the tank including at least one second valve and containing at least one reduction fluid; and
   at least one substrate holder disposed within the enclosure to support at least one substrate.

21. The apparatus of claim 20, wherein a distance between two adjacent second openings is substantially equal to a distance between two adjacent substrate holders.

22. The apparatus of claim 20, wherein the temperature of the first gas is between about 70° C. and about 80° C.

23. The apparatus of claim 20, further comprising:
   a port apparatus coupled to the first enclosure, the port apparatus configured to provide the first gas to the inlet diffuser, the port apparatus comprising:
   a second enclosure;
   at least one inlet diffuser coupled to the first valve,
   a gas provider coupled to the second enclosure, the gas provider configured to provide the first gas to the inlet diffuser through the first valve; and
   an exhaust system coupled to the second enclosure, the exhaust system configured to exhaust a second gas from the first enclosure.

* * * * *